US006306223B1

(12) United States Patent
Joye

(10) Patent No.: US 6,306,223 B1
(45) Date of Patent: Oct. 23, 2001

(54) DEGREASING METHOD USING A SURFACTANT-FREE COMPOSITION

(75) Inventor: Jean-Luc Joye, Cranbury, NJ (US)

(73) Assignee: Rhodia Chimie, Boulogne Billancourt Cedex (FR)

( * ) Notice: Subject to any disclaimer, the term of this patent is extended or adjusted under 35 U.S.C. 154(b) by 0 days.

(21) Appl. No.: 09/230,697

(22) PCT Filed: Jul. 30, 1997

(86) PCT No.: PCT/FR97/01422

§ 371 Date: Apr. 17, 2000

§ 102(e) Date: Apr. 17, 2000

(87) PCT Pub. No.: WO98/05751

PCT Pub. Date: Feb. 12, 1998

(30) Foreign Application Priority Data

Aug. 1, 1996 (FR) .................................................. 96 09752

(51) Int. Cl.$^7$ ........................................................ B08B 3/04
(52) U.S. Cl. ................................. 134/28; 134/2; 134/3; 134/22.17; 134/22.19; 134/25.4; 134/26; 134/34; 134/36; 134/40; 134/41; 134/42; 134/902; 510/175; 510/245; 510/254; 510/365; 510/434
(58) Field of Search ............................... 510/245, 175, 510/259, 365, 434; 134/2, 3, 22.17, 22.19, 25.4, 26, 28, 34, 36, 40, 41, 42, 902

(56) References Cited

U.S. PATENT DOCUMENTS

| 4,673,524 | * | 6/1987 | Dean | 252/118 |
| 4,749,510 | * | 6/1988 | Nelson | 252/166 |
| 4,780,235 | * | 10/1988 | Jackson | 252/170 |
| 4,867,800 | * | 9/1989 | Dishart et al. | 134/40 |
| 4,927,556 | * | 5/1990 | Pokorny | 252/173 |
| 5,030,290 | * | 7/1991 | Davis | 134/4 |
| 5,096,501 | * | 3/1992 | Dishart et al. | 134/10 |
| 5,413,729 | * | 5/1995 | Gaul | 252/162 |
| 5,773,398 | * | 6/1998 | Joye et al. | 510/245 |
| 5,916,860 | * | 6/1999 | Joye et al. | 510/201 |
| 5,962,383 | * | 10/1999 | Doyal et al. | 510/164 |

FOREIGN PATENT DOCUMENTS

| 2121543 | * | 4/1994 | (CA) . |
| WO 96/30453 | * | 10/1996 | (WO) . |
| WO 98/05751 | * | 12/1998 | (WO) . |

* cited by examiner

*Primary Examiner*—Sharidan Carrillo
(74) *Attorney, Agent, or Firm*—Jean-Louis Seugnet

(57) ABSTRACT

The present invention relates to a process for removing fatty substances. According to this process, the following steps are carried out:1) at least a first degreasing operation is carried out on the article to be treated, in the presence of a solvent mixture comprising at least one compound (a) chosen from $C_1$–$C_4$ dialkyl esters of at least one $C_4$–$C_6$ aliphatic diacid, and at least one compound (b) which is miscible in the compound (a) and which at least partially dissolves the fatty substance contaminating the article, 2) at least a second degreasing operation is optionally carried out, in the presence of a solvent mixture comprising at least one compound (a) and at least one compound (b) as defined above, with a compound (a)/compound (b) volume ratio of greater than or equal to 1, 3) a third degreasing operation is carried out in the presence of compound (a), 4) the article thus treated is rinsed with water.

8 Claims, No Drawings

DEGREASING METHOD USING A SURFACTANT-FREE COMPOSITION

BACKGROUND OF THE INVENTION

1. Field of the Invention

The present invention relates to a degreasing process which uses a water-rinsable, surfactant-free composition.

2. Description of the Related Art Including Information Disclosed Under 37 C.F.R. 1.97 and 1.98.

Due to the non-polar or virtually non-polar nature of the fatty substances to be removed, the degreasing solvents for the conventional compositions used are conventionally chosen from products of similar polarity, such as, for example, aliphatic or aromatic hydrocarbon-based solvents. The main drawback associated with such solvents, which is in fact one of the consequences of their choice as constituents in degreasing formulations, relates to their virtual immiscibility in water, which complicates and/or lengthens the step for rinsing the objects treated. In order to facilitate this step, it is common practice to employ surfactants which become associated with the hydrocarbon-based solvent and entrain it during the rinsing step. However, they can in turn pose problems of contamination of the waters and quite often require the use of steps for the additional treatment of the rinsing waters.

BRIEF DESCRIPTION OF THE INVENTION

The process according to the present invention does not present these drawbacks since, with the specific combination of degreasing steps, the process according to the invention makes it possible, firstly, to recycle a large portion of these solvent mixtures.

Secondly, at the end of the treatment, the process according to the invention requires only simple rinsing of the degreased article with water, in the absence of any additive of the surfactant type in the degreasing formulation. Consequently, the contamination problems are all the more reduced.

In addition, the process according to the invention uses compounds which present few risks of explosion under the temperature conditions of the process, which is a definite advantage in terms of the safety of implementation of the operation for degreasing articles.

Thus, the process according to the invention consists in carrying out the following steps:

- at least a first degreasing operation is carried out on the article to be treated, in the presence of a solvent mixture comprising at least one compound (a) chosen from $C_1$–$C_4$ dialkyl esters of at least one $C_4$–$C_6$ aliphatic diacid, and at least one compound (b) which is miscible in the compound (a) and which at least partially dissolves the fatty substance contaminating the article,
- at least a second degreasing operation is optionally carried out, in the presence of a solvent mixture comprising at least one compound (a) and at least one compound (b) as defined above, with a compound (a)/compound (b) volume ratio of greater than or equal to 1,
- a third degreasing operation is carried out in the presence of compound (a),
- the article thus treated is rinsed with water.

However, other advantages and characteristics of the present invention will emerge more clearly on reading the description and the examples which follow.

The process according to the invention thus makes it possible to remove fatty compounds of any type, such as fatty acids, esters of such acids, animal, plant, synthetic or semi-synthetic oils, and greases. The fatty substances liable to form the subject of the degreasing treatment according to the invention may or may not be saturated or comprise one or more unsaturations.

The natural oils and fats are generally glycerol esters. They contain mixtures of fatty acid triglycerides generally mixed with saturated fatty acids.

Sources of animal origin which may be mentioned, in others, are spermwhale oil, dolphin oil, whale oil, seal oil, sardine oil, herring oil, shark oil, cod liver oil; cow hoof oil and cow, pig, horse and sheep fats (tallows).

Examples of sources of plant origin which may be mentioned, inter alia, are rapeseed oil, sunflower oil, groundnut oil, olive oil, walnut oil, corn oil, soybean oil, flax oil, hemp oil, grapeseed oil, coconut oil, palm oil, cottonseed oil, babassu oil, jojoba oil, sesame oil and castor oil.

Mineral oils which may be mentioned are paraffinic oils and naphthenic oils.

The supports which can be treated according to the invention can be very varied in nature. Thus, the composition according to the invention makes it possible to treat metals of any type and alloys thereof, such as steel, stainless steel, aluminium, copper or iron, as well as plastics and mineral glasses.

In point of fact, the present invention is suitable for cleaning printed circuits, without the risk of destroying the said support.

Needless to say, it is suitable for degreasing metal components, for example such as motor components, contaminated with lubricants which are conventional in the sector.

The compounds forming part of the compositions of the mixtures used with the process according to the invention will now be described.

As has been mentioned previously, compound (a) is at least chosen from $C_1$–$C_4$ dialkyl esters of at least one $C_4$–$C_6$ aliphatic diacid.

The diacid esters are, more particularly, esters derived essentially from adipic acids, glutaric acids and succinic acids, the alkyl groups of the ester part being especially chosen from methyl and ethyl groups, but also possibly being propyl, isopropyl, butyl, n-butyl or isobutyl.

According to a particularly advantageous embodiment of the present invention, compound (a) in fact corresponds to a by-product of the preparation of adipic acid, which is one of the main monomers in polyamides. The dialkyl esters are obtained by esterifying this by-product, which generally contains, on a weight basis, from 15 to 30% succinic acid, from 50 to 75% glutaric acid and from 5 to 25% adipic acid.

The diacid esters are products that are commercially available. As commercial products, mention may be made more particularly of Rhodiasolv RPDE® sold by the company Rhône-Poulenc and Du Pont Dibasic Esters® sold by the company Du Pont de Nemours.

It would not constitute a departure from the context of the present invention to use compound (a), as has just been described, in combination with at least one polar aprotic co-solvent such as, for example, lactams or lactones such as N-methyl-2-pyrrolidone or γ-butyrolactone, alkylene glycol ethers, acetonitrile, dimethylformamide, dimethyl sulphoxide or N-methylmorpholine.

When such compounds form part of the composition of the mixture used according to the invention, the amount of these compounds relative to the above mentioned compound (a) is at least 50%, preferably at least 70%.

As regards the compounds (b), these are chosen from compounds which at least partially dissolve the fatty substances.

Moreover, compound (b) forming part of the composition used is miscible in compound (a). Herein below, the term "miscible" will not be used, indifferently, to define both the compounds which are totally miscible in compound (a) and those which are only partially miscible. If compound (b) is only partially miscible with compound (a), then the amount of compound (b) relative to that of compound (a) is such that the mixture remains monophasic.

Preferably, the compound(s) (b) is(are) chosen from non-polar or virtually non-polar solvents which are miscible in compound (a).

Examples of such compounds (b) which can be mentioned are methyl, ethyl and propyl esters of saturated or unsaturated fatty acids, comprising from 4 to 30 carbon atoms. For example, mention may be made of the products of methanolysis in particular of oils, such as rapeseed oils and palm oils, the methyl ester of decanoic acid and the methyl esters of a mixture of saturated acids comprising from 6 to 12 carbon atoms.

Liquid, aliphatic or aromatic hydrocarbon-based solvents which do not form part of flammable liquids can also be used. It is preferred to use solvents whose flash point is greater than 40° C., preferably greater than 70° C. Examples of such solvents which may be mentioned are petroleum derivatives with a high flash point, such as, in particular, mineral spirits with white spirit and naphthas. Commercial products which can be used in the compositions according to the invention are Isopar® from Exxon, Soltrol® from Shell and the Hi-Sol® solvents from Ashland.

According to another advantageous characteristic of the process of the invention, compound (b) is chosen such that it dissolves the fatty substances better at temperatures above room temperature.

According to a particularly advantageous embodiment of the invention, compound (b) contains an aliphatic hydrocarbon-based chain substituted with at least one aryl radical, optionally substituted with at least one alkyl radical.

According to a particularly advantageous embodiment, the optionally substituted aryl radical comprises 6 carbon atoms.

As regards the alkyl substituent, it preferably comprises 1 to 4 carbon atoms. When such an alkyl substituent exists, the bonding between this substituent and the aliphatic hydrocarbon-based chain of compound (b) can take place via one of the carbons on the alkyl substituent, or alternatively directly via one of the carbon atoms on the aromatic ring. According to a preferred variant of the invention, the bonding is achieved via one of the carbon atoms on the aryl part of the substituent.

According to a preferred embodiment, compound (b) comprises at least two aryl radicals, optionally substituted with at least one alkyl radical. A compound (b) comprising two optionally substituted aryl radicals is particularly suitable.

More particularly, the aliphatic chain of compound (b) comprises 3 to 12 carbon atoms and preferably 4 to 10 carbon atoms. It should be pointed out that these values are given taking the longest hydrocarbon-based chain of the molecule into account, excluding substituents. The term "aliphatic chain" denotes saturated or non-saturated chains, i.e. chains comprising at least one ethylenic unsaturation and/or optionally at least one acetylenic unsaturation. The said chain can moreover be linear or branched.

Besides the substituents of the above mentioned type, the hydrocarbon-based aliphatic chain of compound (b) can comprise other substituents, such as alkyl radicals. According to one specific embodiment, the alkyl radicals contain 1 to 4 carbon atoms, the methyl group being preferred.

Compound (b) forming part of the composition of the solvent mixture used in the process of the invention preferably contains an aliphatic chain which is saturated or which comprises at least one ethylenic unsaturation.

According to a preferred embodiment of the invention, compound (b) is 2,4-diphenyl-2-methyl-3-pentene or 2,4-diphenyl-2-methylpentane, alone or as a mixture.

It would not constitute a departure from the context of the present invention to use a mixture of compounds (b) as described previously.

A particularly preferred mixture used according to the process of the invention consists of a compound (a) chosen from $C_1$–$C_4$ dialkyl esters of at least one $C_4$–$C_6$ aliphatic diacid, chosen more articularly from esters of diacids derived essentially from adipic acids, glutaric acids and succinic acids, the alkyl groups of the ester part being especially $C_1$–$C_4$, compound (a) preferably corresponding to a by-product of the preparation of adipic acid, which is one of the main monomers in polyamides, and a compound (b) which is chosen more especially from 2,4-diphenyl-2-methyl-3-pentene and 2,4-diphenyl-2-methylpentane, alone or as a mixture.

The process will now be described.

As has been mentioned previously, a first degreasing operation, which can be referred to as a preliminary degreasing, is carried out to begin with. It is during this first degreasing operation that most of the fatty substances are removed from the surface of the article to be treated.

It should be noted that a single first degreasing cycle with the solvent mixture defined above may suffice. However, it would not constitute a departure from the context of the present invention to use several successive cycles of this first treatment.

The first degreasing operation can be carried out under hot or cold conditions.

It should be noted that, when the treatment is carried out under hot conditions, the treatment is carried out at a temperature below the boiling point of the mixture of the solvents used, but above the solubility temperature of the fatty compounds in the said solvent mixture.

The temperature for the cold treatments is generally less than or equal to room temperature. As a guide, ranges from about 10 to about 30° C. are suitable.

In the case of hot treatments, the temperature is usually above room temperature. For example, ranges from about 25 to 90° C. are appropriate.

When the first degreasing operation is carried out under cold conditions, i.e. more particularly at a temperature of less than or equal to room temperature, the mixture of compounds (a) and (b) is such that the amount of compound (b) is sufficient for the fatty substance to be soluble in the said mixture.

According to this variant, and when the preferred mixture of the invention is used, the compound (a)/compound (b) volume ratio is less than 1.

When the first degreasing operation is carried out under hot conditions, i.e. at a temperature above room temperature, compounds (a) and (b) can be in any respective proportions. Needless to say, a person skilled in the art is capable of determining that it is the minimum amount of compound (b) needed to dissolve a given amount of fatty substance at a given treatment temperature.

However, according to an advantageous characteristic of the invention, the said mixture is such that the amount of compound (b) is less than the amount which is sufficient for the fatty substance to be soluble in the mixture at room temperature.

It should be noted that the smaller the amount of compound (b) relative to that of compound (a), the higher the temperature of the first treatment. Consequently, the person skilled in the art is capable of adapting the respective proportions of one or other of the compounds of the mixture in order to obtain the optimum effect under the temperature conditions of the treatment.

According to this variant, and when the preferred mixture of the invention is used, the compound (a)/compound (b) volume ratio is greater than or equal to 1.

Carrying out the first degreasing step under hot conditions has various advantages, one of the most important of which lies in the possibility of recycling the bath comprising the mixture of compounds (a) and (b) contaminated with the fatty substance(s). The reason for this is that, regularly, or when the bath is saturated with fatty substances, at least some of the bath can be separated off and then cooled so as to obtain a phase separation. Once the phase separation has been achieved, the fat-free fraction is recovered, for reintroduction into the process.

Another advantage of carrying out the said first degreasing operation under hot conditions is that the amount of compound (b) can be minimized, since, at this temperature, the degreasing capacity of the said compound (a) is increased.

Usually, this step is carried out at atmospheric pressure.

The above mentioned solvent mixture can consist of fresh and/or recycled solvents. The term "recycled" denotes either solvents which have been specifically treated in order to remove their contaminants, or at any rate to remove most of them, or solvents which have been transferred from a later step to an earlier step of degreasing, without prior treatment.

Needless to say, it is preferable for the solvent mixture to consist, at least partly, of recycled solvents.

According to a first variant of the invention, some of the solvent mixture comes from the second degreasing step, if this is carried out. It should be noted that the said mixture can be used just as it is, i.e. obtained directly from the second step. Such a situation is possible when the said mixture is not heavily contaminated with the fatty compounds. The reason for this is that most of these fatty compounds were removed during the first degreasing step. Needless to say, an intermediate purification step is not excluded.

According to a second variant of the present invention, the mixture of above mentioned solvents comes at least partly from recycling the said solvent mixture used during this first step, after separating out the fatty compounds which contaminate it.

Depending on the nature of the solvents used, the separation of the solvents and of the fatty compounds is more or less simple. Thus, distillation steps can be carried out, for example. However, if compound (b) has been chosen such that it dissolves the fatty substances better under hot conditions than under cold conditions, purification of the mixture is facilitated. In this case, it suffices, in effect, to cool the mixture obtained from the first step and then decant this mixture and reuse the fat-freed fraction.

It should be noted that if the first degreasing operation is carried out under cold conditions, it is better in a first step to heat the mixture in order to dissolve the fats, and then separate off some of the said mixture, which will be purified as indicated above.

Before reintroducing the solvent mixture, thus purified, into the first or the second degreasing step, the said mixture will be preceded by being heated, if necessary.

Needless to say, the solvent mixture treating the article during this first step can consist of a solvent mixture originating from the second and from the first degreasing step.

This first degreasing step is generally carried out by immersing the article to be treated in the solvent bath. It may be envisaged to proceed by spraying using a nozzle, for example.

When the first degreasing operation is carried out by immersing the article to be degreased, this operation can take place with or without stirring, in the presence or absence of ultrasound.

The duration of the immersion depends on the size of the articles to be treated and on the amount of fatty compounds to be removed, as well as on various economic viability criteria. For example, it usually ranges from a few minutes to one hour.

The article can then undergo a second degreasing step. Preferably, such a step is carried out because it allows the article concerned to be degreased more thoroughly.

The composition of the mixture used in this second degreasing step is specific, since the compound (a)/compound (b) volume ratio is greater than or equal to 1. Preferably, the said volume ratio is greater than 1.

This treatment step can also be carried out under hot or cold conditions, according to the definition given for the preceding degreasing step.

Advantageously, it is not necessary to carry out this second step under hot conditions, or at any rate at a very high temperature, since most of the fatty compounds have been removed during the first step. Given the relatively small amounts of fatty compounds remaining on the surface of the article, the efficacy of the treatment according to this second step at a temperature close to room temperature (20–40° C.) can be judged sufficient.

This second step of degreasing the article is generally carried out by immersing the article in the solvent bath, with or without stirring, with or without ultrasound, or alternatively by spraying.

The duration of the immersion can be readily determined by a person skilled in the art. It is generally between a few minutes and one hour.

It would not constitute a departure from the context of the present invention to use several cycle of this second degreasing operation.

The product obtained from the first degreasing operation, or optionally from the second degreasing operation, is then subjected to a third degreasing step in the presence of compound (a).

The main aim of this finishing step is to remove any trace of compound (b) remaining on the surface of the article to be treated. The reason for this is that, during this step, virtually all of the fatty compounds, and preferably all of these compounds, have been removed from the surface of the article. Now, on account of its at least partial solubility in compound (a), compound (b) is entrained during this operation. Thus, it is no longer necessary to use surfactants in order to facilitate removal of the product dissolving the fatty substances.

This step can take place by immersion, with or without stirring, and with or without ultrasound. However, it is preferred to carry it out by spraying using a nozzle, for example.

The solvent obtained from this step can be recycled into any step of the process, from the first to the last.

The treatment generally takes place at room temperature. Depending in particular on the size of the article, the duration of the treatment is conventionally from a few minutes to one hour.

Lastly, the process according to the invention is completed by a step of rinsing the article thus cleaned with water.

In order to limit the losses of compound (a), the article is preferably drained before carrying out this rinsing, which can take place by immersion or spraying, the first route being preferred. The draining can be carried out according to any method known to those skilled in the art, such as natural running-off or under the action of a jet of air.

The water recovered at this stage can be recycled until the solvent concentration is above the solubility limit of the said solvent in water. In this case, the mixture will be decanted in order to reintroduce the solvent into one and/or other of the steps of the process.

As regards the water, several cases can be envisaged. It can be recycled into the rinsing step. It may or may not undergo a separation step in order to remove the traces of solvents before it is discarded.

It should be noted that, when preferred mixtures are used, i.e. compositions based on $C_1$–$C_4$ dialkyl esters of at least one $C_4$–$C_6$ aliphatic diacid, and 2,4-diphenyl-2-methylpentane and/or 2,4-diphenyl-2-methylpentene, on account of the low concentration of this solvent in the waters, of properties of biodegradability and of non-ecotoxicity of the above mentioned compound (a), it is possible to dispense with rigorous treatment, or even treatment, of the residual waters before they are discarded.

As may be observed, the mixture according to the invention does not require the use of specific additives such as surfactants, thickeners or other additional compounds, and this has no harmful consequences on the process or its efficacy.

EXAMPLE 1

The process illustrates the degreasing of a metal plate contaminated with paraffinic oil Neutral 100® oil (Mobil).

The plate is immersed for 15 seconds in a bath comprising, as degreasing composition:

70% by volume of Rhodiasolv RPDE® (Rhône-Poulenc Chimie)

30% by volume of 2,4-diphenyl-2-methylpentane.

The step is carried out at a temperature of 60° C.

It should be noted that when the degreasing composition in this immersion bath is saturated with paraffinic oil, it suffices to cool the contaminated composition and then carry out a decantation. The fraction comprising the composition can then be reused, and the fraction comprising the oil is separated off.

A second treatment step is then carried out by immersion for 10 seconds, at room temperature, with a composition comprising only RPDE.

Finally, the plate thus treated is rinsed with mains water, at 17° C., at a flow rate of 2 liters/minute.

The degreasing performance is evaluated according to ASTM standard F22-65, which consists in checking the surface covered by the film of water after rinsing. The following gradings are attributed, depending on the surface covered:

| Surface covered | Grade | Degreasing power |
| --- | --- | --- |
| None | 0 | None |
| Less than ⅓ | 1 | Poor |
| Between ⅓ and ⅔ | 2 | Average |
| More than ⅔ | 3 | Good |
| All | 4 | Excellent |

According to this standard, the plate treated in accordance with the invention is totally coated with the film of water. The grade 4 is thus attributed.

EXAMPLE 2

The process illustrates the degreasing of a metal plate contaminated with paraffinic oil Neutral 100® oil (Mobil).

The plate is immersed for 15 seconds in a bath comprising, as degreasing composition:

50% by volume of Rhodiasolv RPDE® (Rhône-Poulenc Chimie)

50% by volume of 2,4-diphenyl-2-methylpentane.

The step is carried out at a temperature of 25° C.

A second treatment step is then carried out by immersion for 10 seconds, at room temperature with a composition comprising only RPDE.

Finally, the plate thus treated is rinsed with mains water, at 17° C., at a flow rate of 2 liters/minute.

The degreasing performance is evaluated according to the above mentioned ASTM standard F22-65. The note attributed after the treatment is 4.

What is claimed is:

1. A process for removing fatty compounds from an article having a surface, comprising the steps of:

1) carrying out on the surface of the article at least a first degreasing operation, with a surfactant-free solvent mixture comprising at least one compound (a) being a $C_1$–$C_4$ dialkyl ester of at least one $C_4$–$C_6$ aliphatic diacid, and at least one compound (b) being miscible in the compound (a) and dissolving the fatty compounds, and contaminating the article, 2) optionally, carrying out at least a second degreasing operation with a solvent mixture comprising one or more of the compound (a) and one or more of the compound (b), with a compound (a)/compound (b) volume ratio of greater than or equal to 1, 3) carrying out a third degreasing operation with only the compound (a) to remove any trace of the compound (b) at the surface of said article, and 4) rinsing the article with water.

2. The process according to claim 1, wherein said compound (a) is an alkylester of adipic acid, glutaric acid, or succinic acid, the alkyl groups of the ester part being methyl, ethyl, propyl, isopropyl, butyl, n-butyl, or isobutyl.

3. The process according to claim 1, wherein said compound (b) is a compound comprising an aliphatic hydrocarbon chain substituted with at least one aryl or alkylaryl group.

4. The process according to claim 1, wherein step 1) is carried out at a temperature ranging from about 10 to about 30° C. from about 25 to 90° C.

5. The process according to claim 1, wherein step 1) is carried out at a temperature.

6. The process according to claim 1, wherein steps 1), 2), or 3) are carried out by immersing the article in the solvent mixture, or by spraying.

7. The process according to claim 3, wherein said aliphatic hydrocarbon chain comprises 3 to 12 carbon atoms.

8. The process according to claim 7, wherein said compound (b) is 2,4-diphenyl-2-methylpentane or 2,4-diphenyl-2-methylpentene.

* * * * *